(12) United States Patent
Atias et al.

(10) Patent No.: US 12,004,308 B2
(45) Date of Patent: Jun. 4, 2024

(54) PROCESS FOR LAMINATING GRAPHENE-COATED PRINTED CIRCUIT BOARDS

(71) Applicants: Mellanox Technologies, Ltd., Yokneam (IL); BAR-ILAN UNIVERSITY, Ramat Gan (IL); PCB Technologies Ltd, Migdal Ha'emeq (IL)

(72) Inventors: Boaz Atias, Maale Adumim (IL); Elad Mentovich, Tel Aviv (IL); Yaniv Rotem, Nesher (IL); Doron Naveh, Petah-Tikva (IL); Adi Levi, Rosh HaAyin (IL); Yosi Ben-Naim, Eilat (IL); Yaad Eliya, Magen Shaul (IL); Shlomo Danino, Netanya (IL); Eran Lipp, Hefer (IL)

(73) Assignees: Mellanox Technologies, Ltd., Yokneam (IL); BAR-ILAN University, Ramat Gan (IL); PCB Technologies Ltd, Migdal Ha'emeq (IL)

( * ) Notice: Subject to any disclaimer, the term of this patent is extended or adjusted under 35 U.S.C. 154(b) by 306 days.

(21) Appl. No.: 17/305,205

(22) Filed: Jul. 1, 2021

(65) Prior Publication Data

US 2022/0377912 A1 Nov. 24, 2022

Related U.S. Application Data

(60) Provisional application No. 63/201,910, filed on May 18, 2021.

(51) Int. Cl.
*H05K 1/02* (2006.01)
*B32B 15/14* (2006.01)
(Continued)

(52) U.S. Cl.
CPC ......... *H05K 3/4652* (2013.01); *C01B 32/184* (2017.08); *H05K 3/388* (2013.01);
(Continued)

(58) Field of Classification Search
CPC ...... H05K 1/02; H05K 1/0201; H05K 1/0209; H05K 1/0306; H05K 1/0313;
(Continued)

(56) References Cited

U.S. PATENT DOCUMENTS

| 3,672,948 A | 6/1972 | Foehring |
| 4,417,722 A | 11/1983 | Ishii |

(Continued)

FOREIGN PATENT DOCUMENTS

| DE | 112013006022 T5 | 9/2015 |
| EP | 3723122 A1 | 10/2020 |
| WO | 2020152358 A1 | 7/2020 |

OTHER PUBLICATIONS

Steinberg et al., pending U.S. Appl. No. 18/200,314, filed May 22, 2023.

(Continued)

*Primary Examiner* — Xiaoliang Chen
(74) *Attorney, Agent, or Firm* — Moore & Van Allen PLLC; Michele M. Glessner

(57) ABSTRACT

Processes for laminating a graphene-coated printed circuit board (PCB) are disclosed. An example laminated PCB may include a lamination stack that may include an inner core, an adhesive layer, and at least one graphene-metal structure. Pressure and heat—which may be applied under vacuum or controlled gas atmosphere—may be applied to the lamination stack, after all materials have been placed. The graphene of the graphene-metal structure is designed to promote high frequency performance and heat management within the PCB.

34 Claims, 5 Drawing Sheets

(51) Int. Cl.
  *C01B 32/182* (2017.01)
  *C01B 32/184* (2017.01)
  *C08J 7/043* (2020.01)
  *C08J 7/044* (2020.01)
  *C08J 7/046* (2020.01)
  *C08J 7/06* (2006.01)
  *H01L 21/683* (2006.01)
  *H05K 1/09* (2006.01)
  *H05K 3/38* (2006.01)
  *H05K 3/46* (2006.01)

(52) U.S. Cl.
  CPC .............. *H05K 2203/085* (2013.01); *H05K 2203/1338* (2013.01)

(58) Field of Classification Search
  CPC ...... H05K 1/0326; H05K 1/0346; H05K 1/09; H05K 1/144; H05K 3/0041; H05K 3/0064; H05K 3/025; H05K 3/381; H05K 3/388; H05K 3/4629; H05K 3/4652; H05K 2201/0145; H05K 2201/0212; H05K 2201/0215; H05K 2201/0323; H05K 2201/066; H05K 2201/10159; H05K 2203/0152; H05K 2203/04103; H05K 2203/085; H05K 2203/1338; H01L 21/02425; H01L 21/02527; H01L 21/02568; H01L 21/187; H01L 21/683; H01L 21/6835; H01L 21/76251; C01B 32/182; C01B 32/184; C08J 7/043; C08J 7/044; C08J 7/046; C08J 7/06; B32B 15/08; B32B 15/14
  USPC ....... 361/765, 305; 428/41.8, 164, 172, 332, 428/413, 423.1, 426, 447, 457, 500, 532, 428/688; 427/122, 249.1, 331, 532; 438/98, 478
  See application file for complete search history.

(56) References Cited

U.S. PATENT DOCUMENTS

| | | | |
|---|---|---|---|
| 4,450,034 A | 5/1984 | Stern | |
| 4,455,181 A | 6/1984 | Lifshin et al. | |
| 4,931,425 A | 6/1990 | Kimura | |
| 5,108,532 A | 4/1992 | Thein et al. | |
| 5,256,474 A | 10/1993 | Johnston | |
| 6,432,239 B1* | 8/2002 | Mandai | H05K 3/4629 156/89.12 |
| 9,215,797 B2* | 12/2015 | Mori | G06F 3/045 |
| 9,384,875 B2* | 7/2016 | Kimura | B82Y 40/00 |
| 9,431,487 B2* | 8/2016 | Bol | H01L 21/0262 |
| 9,924,619 B2* | 3/2018 | Kim | B32B 9/04 |
| 10,022,947 B2* | 7/2018 | Kimura | B32B 38/10 |
| 10,518,506 B2 | 12/2019 | Miyazono et al. | |
| 10,717,260 B2* | 7/2020 | Shimizu | B32B 37/0053 |
| 11,105,567 B2* | 8/2021 | Fan | H01L 23/373 |
| 2005/0112344 A1 | 5/2005 | Redfern et al. | |
| 2006/0042059 A1 | 3/2006 | Satoh | |
| 2010/0047447 A1 | 2/2010 | Cook | |
| 2010/0196124 A1 | 8/2010 | Fukuma et al. | |
| 2011/0076118 A1 | 3/2011 | Kurita et al. | |
| 2011/0091646 A1 | 4/2011 | Aliatieh | |
| 2011/0123776 A1* | 5/2011 | Shin | C01B 32/182 428/688 |
| 2013/0189635 A1 | 7/2013 | Lim | |
| 2013/0248229 A1 | 9/2013 | Martens | |
| 2013/0299077 A1 | 11/2013 | Hong | |
| 2013/0344246 A1 | 12/2013 | Li | |
| 2014/0053973 A1* | 2/2014 | Shin | B32B 7/12 156/241 |
| 2015/0064470 A1* | 3/2015 | Kimura | B32B 38/10 156/247 |
| 2015/0123080 A1* | 5/2015 | Yamaguchi | H01L 29/7781 257/29 |
| 2015/0360370 A1 | 12/2015 | Mazzocco et al. | |
| 2016/0027935 A1* | 1/2016 | Naito | H01L 31/0749 438/98 |
| 2016/0049475 A1* | 2/2016 | Bol | H01L 29/1606 257/29 |
| 2016/0076829 A1* | 3/2016 | Lee | F28F 21/08 428/41.8 |
| 2016/0079001 A1* | 3/2016 | Lin | H01G 4/1245 361/305 |
| 2016/0093478 A1 | 3/2016 | Guo | |
| 2017/0029279 A1 | 2/2017 | Kim | |
| 2017/0125136 A1* | 5/2017 | Park | H01L 31/022466 |
| 2017/0130336 A1 | 5/2017 | Fujikura | |
| 2017/0207484 A1* | 7/2017 | Zhamu | H01M 10/0525 |
| 2017/0211706 A1 | 7/2017 | Amir | |
| 2017/0273181 A1* | 9/2017 | Sohn | H10K 50/805 |
| 2017/0290167 A1* | 10/2017 | Pun | H05K 1/0346 |
| 2017/0338312 A1* | 11/2017 | Treossi | B32B 9/007 |
| 2019/0047262 A1* | 2/2019 | Minakuchi | B32B 27/308 |
| 2019/0143369 A1* | 5/2019 | Lin | C25D 5/56 427/532 |
| 2019/0143656 A1* | 5/2019 | Lin | B32B 9/007 428/164 |
| 2019/0145007 A1* | 5/2019 | Lin | C25D 3/38 428/328 |
| 2019/0283377 A1* | 9/2019 | Lin | B32B 15/08 |
| 2019/0283378 A1* | 9/2019 | Lin | B32B 15/08 |
| 2019/0283379 A1* | 9/2019 | Lin | B32B 15/08 |
| 2019/0284712 A1* | 9/2019 | Lin | C01B 32/198 |
| 2019/0292675 A1* | 9/2019 | Lin | C08J 7/043 |
| 2019/0292676 A1* | 9/2019 | Lin | C08J 7/044 |
| 2019/0292720 A1* | 9/2019 | Lin | C01B 32/194 |
| 2019/0292721 A1* | 9/2019 | Lin | C03C 25/46 |
| 2019/0292722 A1* | 9/2019 | Lin | D06M 11/74 |
| 2021/0091368 A1* | 3/2021 | House | H01M 4/525 |
| 2021/0091383 A1* | 3/2021 | House | H01G 11/28 |
| 2021/0100090 A1* | 4/2021 | Chang | H05K 1/0201 |
| 2021/0139700 A1* | 5/2021 | Arimoto | B32B 27/00 |
| 2021/0184181 A1* | 6/2021 | Ding | H10K 71/80 |
| 2021/0260859 A1 | 8/2021 | Le Rhun et al. | |
| 2022/0131040 A1* | 4/2022 | Chen | H01L 33/46 |
| 2022/0161537 A1 | 5/2022 | Quellmalz et al. | |
| 2022/0169002 A1* | 6/2022 | Honda | C09J 5/00 |
| 2022/0204348 A1 | 6/2022 | Gao et al. | |
| 2022/0372621 A1 | 11/2022 | Mentovich | |
| 2022/0372622 A1 | 11/2022 | Mentovich | |
| 2022/0377907 A1 | 11/2022 | Mentovich | |
| 2023/0002906 A1 | 1/2023 | Mentovich | |
| 2023/0007788 A1 | 1/2023 | Atias | |
| 2023/0007789 A1 | 1/2023 | Mentovich | |

OTHER PUBLICATIONS

Steinberg et al., pending U.S. Appl. No. 18/200,352, filed May 22, 2023.

Chinese Office Action from corresponding Chinese Application No. 202210515308.4 dated Oct. 28, 2023, 4 pages, with English Translation.

* cited by examiner

PROCESS FOR LAMINATING GRAPHENE-COATED PRINTED CIRCUIT BOARDS

CROSS-REFERENCE TO RELATED APPLICATIONS

This application claims priority to U.S. Provisional Patent Application No. 63/201,910, filed May 18, 2021, the contents of which are incorporated herein by reference in their entirety.

TECHNOLOGICAL FIELD

Embodiments of the present invention relate generally to processes for laminating graphene-coated printed circuit boards (PCBs).

BACKGROUND

A PCB is used to electrically connect electronic components using conductive pathways, or traces, etched from metal sheets. The metal sheets are often laminated onto non-conductive materials, which may be referred to as the "core" of the PCB. For instance, one such type of metal sheet may be comprised of copper or nickel. As the demand for higher bandwidth increases, so too does the demand for higher frequency performance and heat management of PCBs.

BRIEF SUMMARY

Embodiments of the present invention provide an improved process for laminating PCBs using a graphene coating over a metal material. The improvements provided by embodiments of the present invention further include an improved PCB comprising a graphene-coating used to promote higher frequency performance of PCBs, better heat management of PCBs, higher thermal conductivity of PCBs, and higher electron mobility within PCBs.

In some embodiments, the process for laminating graphene-coated printed circuit boards may include an apparatus to apply each of the materials discussed in further detail below and carry out the processes herein described. An example apparatus may include a continuous-feed CVD system described in the application titled, CONTINUOUS-FEED CHEMICAL VAPOR DEPOSITION SYSTEM, Ser. No. 17/305,203, filed concurrently with the present application and the contents of which are hereby incorporated by reference in their entirety. Further, in some embodiments, the continuous-feed CVD system may include a substrate carrier and associated mechanisms for moving the lamination stack and printed circuit board through the continuous-feed CVD system, such as the substrate carrier and associated mechanisms described in the application titled, CVD SYSTEM WITH SUBSTRATE CARRIER AND ASSOCIATED MECHANISMS FOR MOVING SUBSTRATE THERETHROUGH, Ser. No. 17/305,206, filed concurrently with the present application and the contents of which are hereby incorporated by reference in their entirety. Further, in some embodiments, the continuous-feed CVD system may include components configured for facilitating uniform and laminar flow, such as the components described in the application titled, CVD SYSTEM WITH FLANGE ASSEMBLY FOR FACILITATING UNIFORM AND LAMINAR FLOW, Ser. No. 17/305,209, filed concurrently with the present application and the contents of which are hereby incorporated by reference in their entirety.

In some embodiments, the process for laminating graphene-coated printed circuit boards may include the process for repairing the graphene-coated lamination stack and printed circuit board, such as the materials and processes described in the application titled, PROCESS FOR LOCALIZED REPAIR OF GRAPHENE-COATED LAMINATION STACKS AND PRINTED CIRCUIT BOARDS, Ser. No. 17/305,233, filed concurrently with the present application and the contents of which are hereby incorporated by reference in their entirety. Further, in some embodiments, the process for localized repair of graphene-coated lamination stacks and printed circuit boards include the materials and processes including the material of hexagonal Boron Nitride (h-BN) as an alternative coating to the lamination stack and printed circuit board and methods for doping and removing structures within the lamination stacks and printed circuit boards, such as the materials and processes described in the application titled, PROCESS FOR LAMINTATING CONDUCTIVE-LUBRICANT COATED METALS FOR PRINTED CIRCUIT BOARDS, Ser. No. 17/305,223, filed concurrently with the present application and the contents of which are hereby incorporated by reference in their entirety. Further, in some embodiments, the process for localized repair of graphene-coated lamination stacks and printed circuit boards include the materials and processes to create a two-dimensional-target structure (including graphene coating of such two-dimensional-target structures), such as the methods and products described in the application titled, PROCESS FOR APPLYING A TWO-DIMENSIONAL MATERIAL TO A TARGET SUBSTRATE POST-LAMINATION, Ser. No. 17/305,238, filed concurrently with the present application and the contents of which are hereby incorporated by reference in their entirety.

Accordingly, example embodiments of the present invention relate generally to system(s), methods and apparatuses to provide an improved lamination process for graphene-coated metals within PCBs. The details of some embodiments of the subject matter described in this specification are set forth in the accompanying drawings and the description below. Other features, aspects, and advantages of the subject matter will become apparent from the description, the drawings, and the claims.

In accordance with some embodiments of the present invention, a method of formatting a lamination stack is provided, wherein the lamination stack comprises a process of providing a core (i.e., dielectric core which comprises dielectric properties), applying an adhesive layer to a top surface of the core, and attaching a graphene-metal structure to a top surface of the core via the adhesive layer, wherein the graphene-metal structure comprises a metal layer and a graphene layer on at least one of a top surface of the metal layer or a bottom surface of the metal layer.

In accordance with another aspect of the present invention, the method of formatting a lamination stack may further comprise applying a cool down period to the lamination stack, wherein the cool down period comprises a steady decrease in temperature over a duration of the cool down period.

In accordance with another aspect of the present invention, the method of formatting a lamination stack may further comprise heating the lamination stack from a base of the lamination stack.

In accordance with another aspect of the present invention, the method of form a lamination stack further includes the aspect wherein the graphene-metal structure is a first graphene-metal structure, and the method further comprises attaching a second graphene-metal structure to a top surface of the first graphene-metal structure, wherein the second graphene-metal structure comprises a second metal layer and a second graphene layer on at least one of a top surface of the second metal layer or a bottom surface of the second metal layer. Additionally, another aspect of the present invention may comprise defining one or more holes through the metal layer of the first graphene-metal structure, the second metal layer of the second graphene-metal structure, and intervening layers. Another aspect of the present invention may further comprise filling the one or more holes with conductive material.

In accordance with another aspect of the present invention, the method of form a lamination stack further includes the aspect may comprise applying a second adhesive layer to a bottom surface of the core. In accordance with another aspect of the present invention, the method of form a lamination stack further comprise applying a third graphene-metal structure to a bottom surface of the second adhesive layer, wherein the third graphene-metal structure comprises a third metal layer and a third graphene layer on at least a top surface of the third metal layer or a bottom surface of the third metal layer. Additionally, another aspect of the present invention may comprise attaching a fourth graphene-metal structure to a bottom surface of the third graphene-metal structure, wherein the fourth graphene-metal structure comprises a fourth metal layer and a fourth graphene layer on at least one of a top surface of the fourth metal layer or a bottom surface of the fourth metal layer.

In accordance with another aspect, a lamination stack is provided. The lamination stack may comprise a core; an adhesive layer applied to a top surface of the core; and a graphene-metal structure attached to a top surface of the core via the adhesive layer, wherein the graphene-metal structure comprises a metal layer and a graphene layer on at least one of a top surface of the metal layer or a bottom surface of the metal layer.

In accordance with another aspect of the present invention, the lamination stack may include the embodiment wherein the graphene-metal structure is a first graphene-metal structure, and the lamination stack further comprises a second graphene-metal structure attached to a top surface of the first graphene-metal structure, wherein the second graphene-metal structure comprises a second metal layer and a second graphene layer at least on of a top surface of the second metal layer or a bottom surface of the second metal layer. In another aspect of the present invention, the lamination stack may further comprise a second adhesive layer applied to a bottom surface of the core. Additionally, and in accordance with the present embodiment, the lamination stack may further comprise a third graphene-metal structure attached to a bottom surface of the core via the second adhesive layer, and wherein the third graphene-metal structure comprises a third metal layer and a third graphene layer on at least one of a top surface of third metal layer or a bottom surface of third metal layer. In accordance with the present invention, the lamination stack may further comprise a fourth graphene-metal structure attached to a bottom surface of the third graphene-metal structure, and wherein the fourth graphene-metal structure comprises a fourth metal layer and a fourth graphene layer on at least one of a top surface of the fourth metal layer or a bottom surface of the fourth metal layer.

In accordance with another aspect of the present invention, the lamination stack may further comprise one or more holes, wherein each hole is defined by the metal layer of the first graphene-metal structure, the second metal layer of the second graphene-metal structure, and intervening layers. The lamination stack may further include the aspect wherein the one or more holes are filled with conductive material.

BRIEF DESCRIPTION OF THE DRAWINGS

Figure 1A:
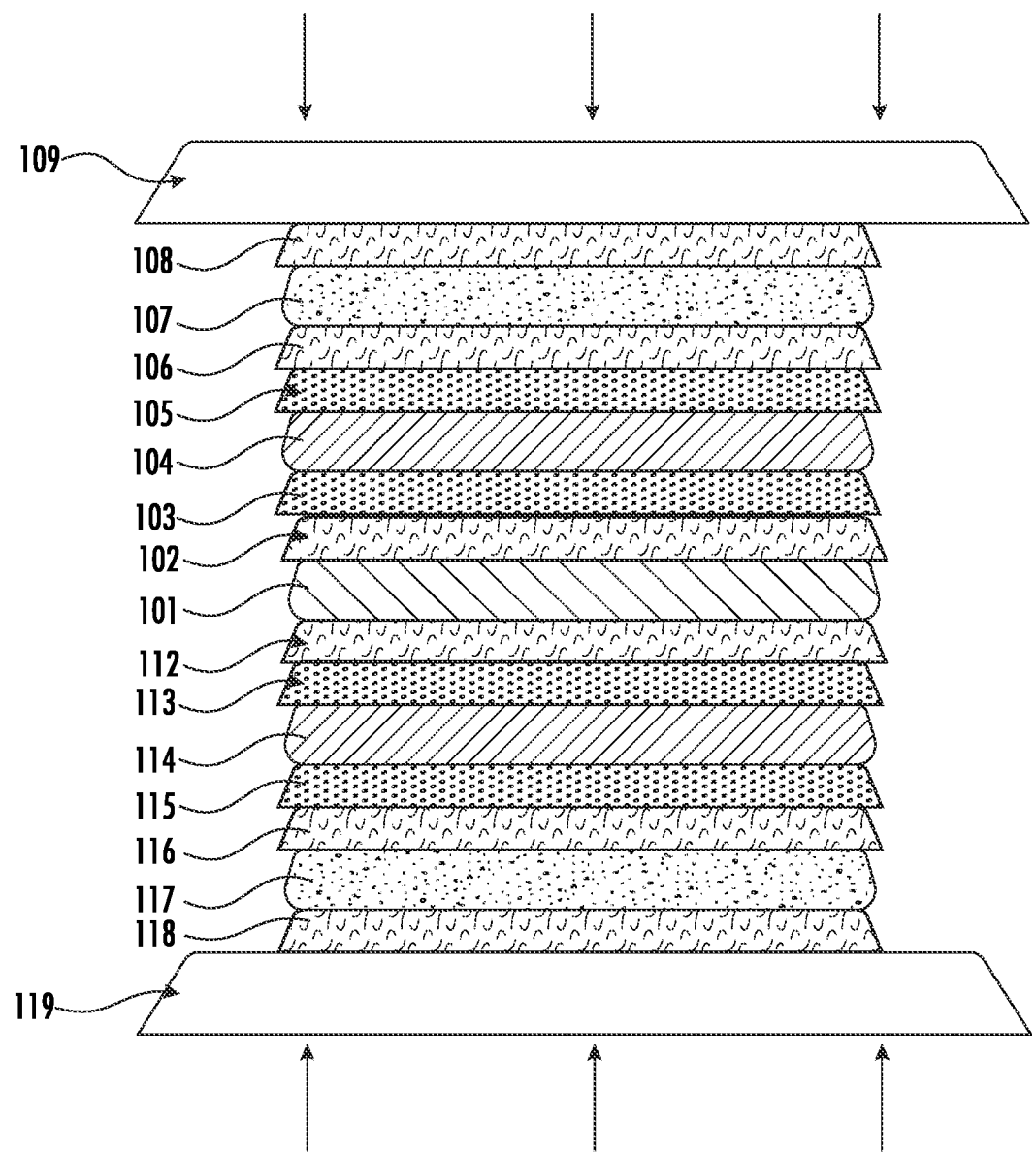
Figure 1B:
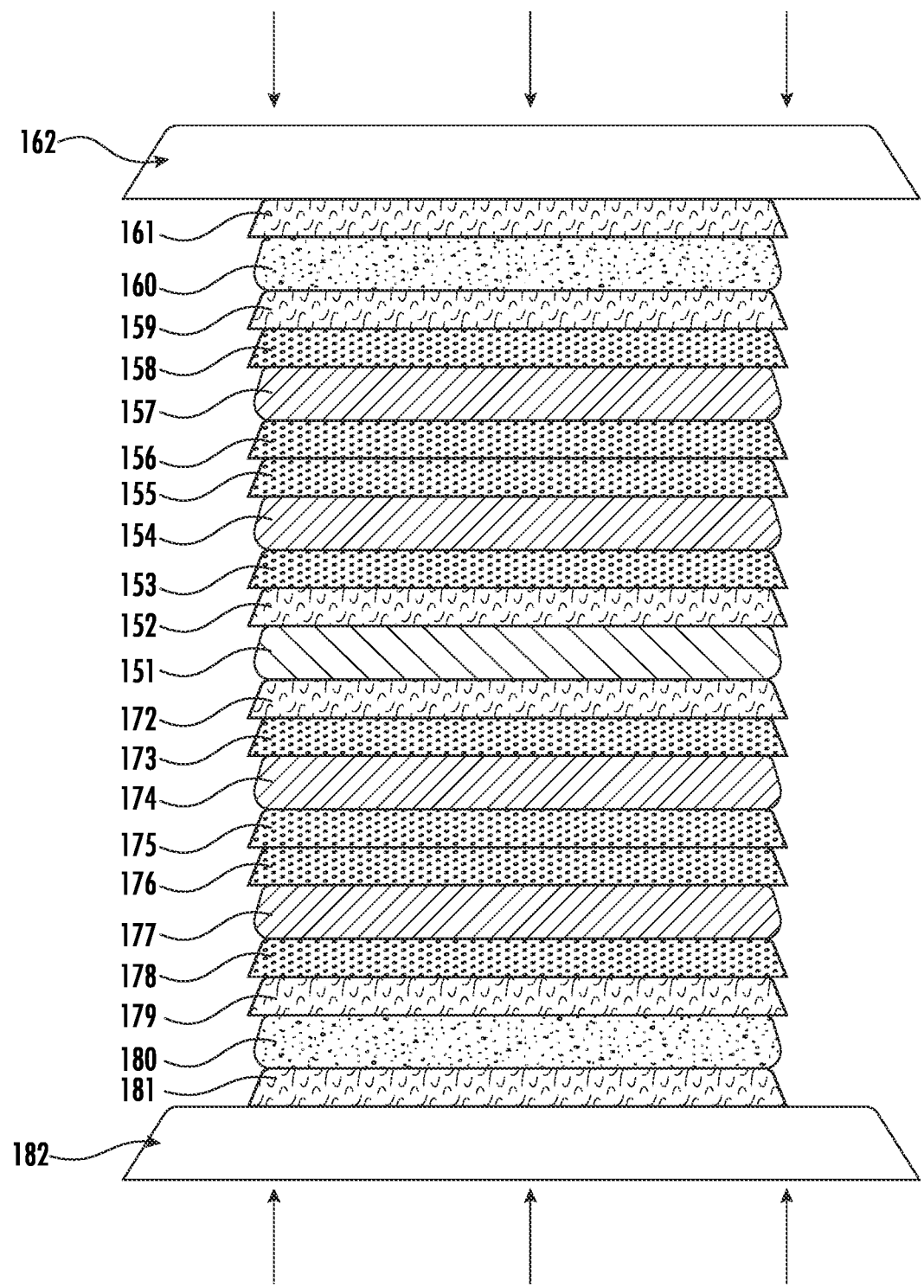
Figure 2:
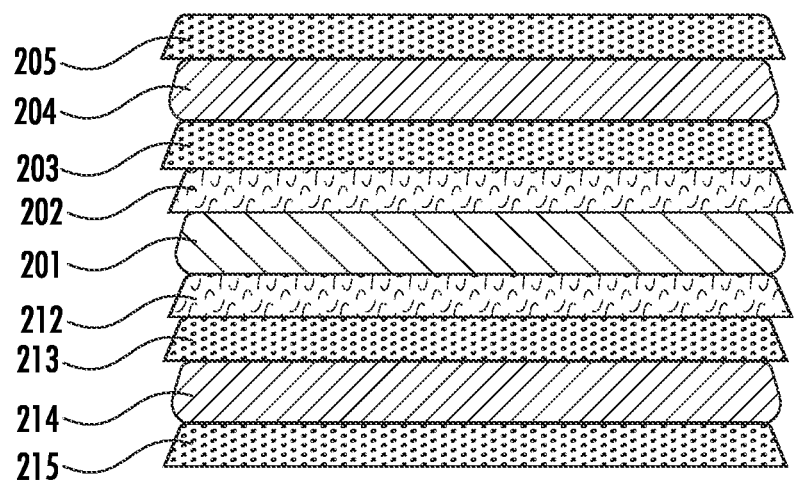
Figure 3:
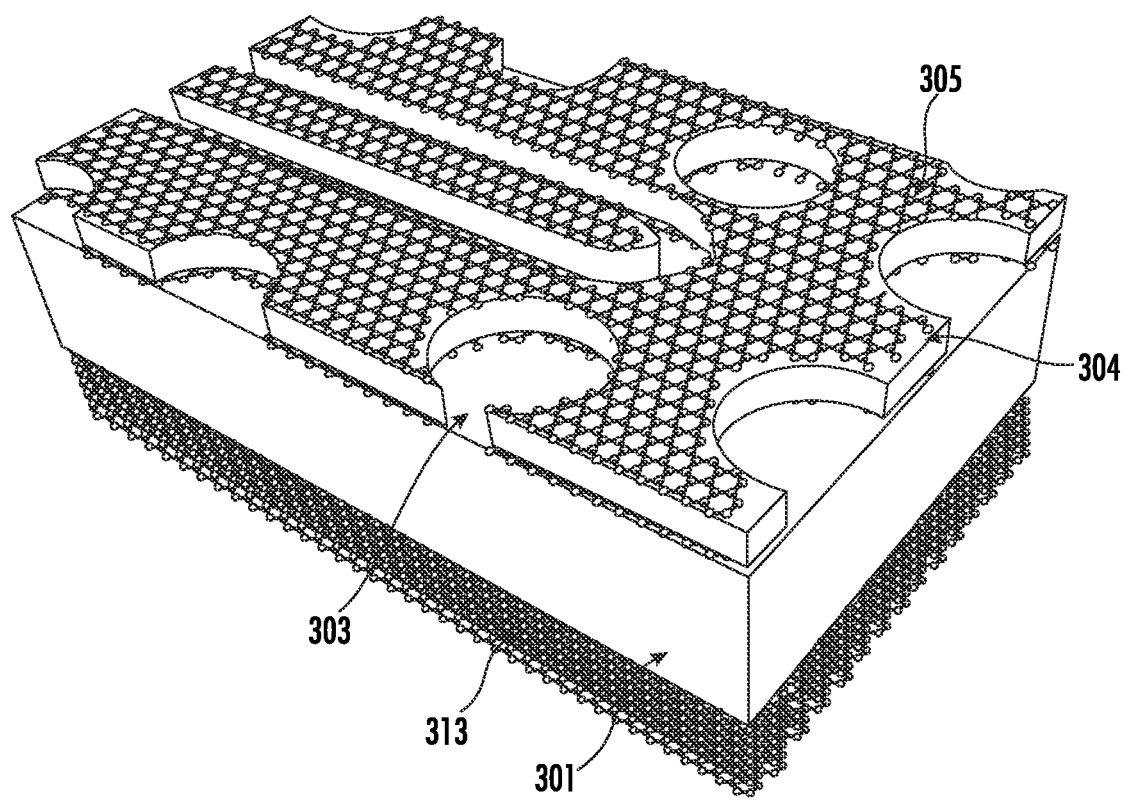
Figure 4:
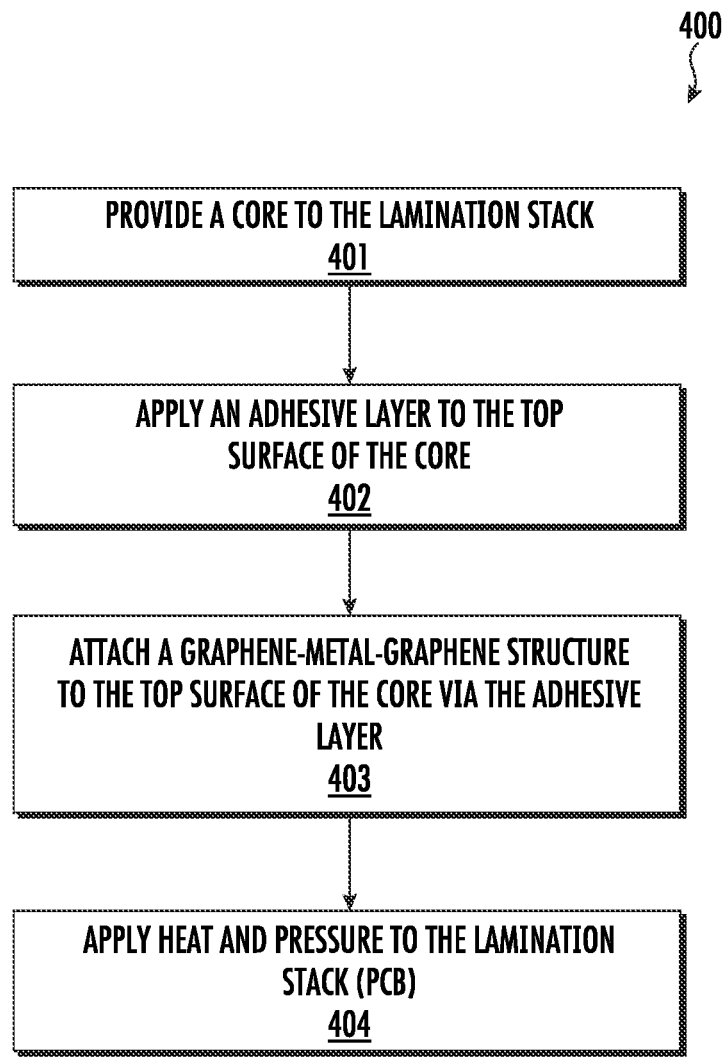

Having thus described the disclosure in general terms, reference will now be made to the accompanying drawings, which are not necessarily drawn to scale, and wherein:

FIG. 1A illustrates a side-view of a lamination stack associated with a PCB comprising at least a graphene-metal structure, in accordance with one or more embodiments of the present invention;

FIG. 1B illustrates another side-view of a lamination stack associated with a PCB comprising at least a graphene-metal structure, in accordance with other embodiments of the present invention;

FIG. 2 illustrates a side-view of a lamination stack prior to the lamination process, in accordance with one or more embodiments of the present invention;

FIG. 3 illustrates an example PCB, post-lamination process, rotated at a 45-degree angle, in accordance with one or more embodiments of the present invention; and FIG. 4 provides an example flowchart of the lamination process, in accordance with one or more embodiments of the present invention.

DETAILED DESCRIPTION

Example embodiments will now be described more fully hereinafter with reference to the accompanying drawings, in which some, but not all, embodiments are shown. Indeed, the embodiments may take many different forms and should not be construed as limited to the embodiments set forth herein; rather, these embodiments are provided so that this disclosure will satisfy applicable legal requirements. Like reference numerals refer to like elements throughout. The terms "exemplary" and "example" as may be used herein are not provided to convey any qualitative assessment, but instead merely to convey an illustration of an example. As used herein, terms such as "front," "rear," "top," "inside," "outside," "inner," "outer," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances. Thus, use of any such terms should not be taken to limit the spirit and scope of embodiments of the present invention.

A lamination stack, generally, may be understood to be the stack, or layers, of materials used to create a PCB. For example, such materials may include a non-conductive material (e.g., the core) which may further comprise dielectric properties, an adhesive layer, and a conductive metal such as copper. The lamination stack may then be laminated (i.e., heated and/or pressurized under vacuum or controlled gas atmosphere) to solidify a bond between the materials to create the structure of the PCB. In some aspects of the present invention, heat may be applied to the base of the lamination stack (e.g., from below the lamination stack), applied to the top of the lamination stack (e.g., from a heat-source placed above the lamination stack), or applied to surround the lamination stack (e.g., similar to an oven chamber heating the lamination stack from multiple sides).

The metal material (e.g., copper) may then be etched to create the conductive trace of the PCB.

In the present invention, a lamination stack comprising a graphene-metal structure, rather than just a metal layer (e.g., copper), is described, where the graphene-metal structure allows the PCB to have improved high frequency performance and improved heat management. The graphene-metal structure is arranged on or around the core of the PCB. An adhesive layer may be used to attach the graphene-metal structure to the core of the lamination stack at the pre-processing stage of the PCB. By adding a graphene-metal structure to a lamination stack, where traditionally only a metal structure is placed on the lamination stack, the PCB has improved properties over the prior art. For instance, graphene improves heat management because of its high heat conductivity properties, promotes higher electrical conductivity, and allows higher electron mobility, without having to make allowances for thickness on a PCB (i.e., graphene is extremely thin as a monolayer).

With reference to FIG. 1A, a core 101 is provided as the non-conductive material of the lamination stack of the PCB. The adhesive layer(s) 102, 112 of the lamination stack may be applied directly to a surface of the core 101. The adhesive layer(s) 102, 112 may be applied to the bottom or top surface of the core 101, or both surfaces of the core 101 within the lamination stack. A graphene-metal structure 103, 104, 105 may be attached to a top surface of the core 101 using the adhesive layer 102. Another graphene-metal structure 113, 114, 115 may be attached to a bottom surface of the core 101 using the adhesive layer 112.

In some embodiments, the graphene-metal structure 103, 104, 105 may comprise only one graphene layer and one metal structure when it is attached to a surface of the core (e.g., 103, 104 for a bottom/inner graphene layer or 104, 105 for a top/outer graphene layer). The graphene-metal structure, in those noted embodiments, may comprise a graphene layer on the bottom/inner surface of the metal structure (e.g., 103 and 104 of FIG. 1A) on the top surface of the core 101; a graphene layer on the top surface of the metal structure (e.g., 104 and 105 of FIG. 1A) on the top/outer surface of the core 101; a graphene layer on the bottom/outer surface of the metal structure (e.g., 114 and 115 of FIG. 1A) on the bottom surface of the core 101; a graphene layer on the top/inner surface of the metal structure (e.g., 113 and 114 of FIG. 1A) on the bottom surface of the core; or any combination thereof.

In yet other embodiment, the graphene metal structure of FIG. 1A may comprise a metal structure having a graphene layer on both a top surface and a bottom surface attached to the core 101. An example of such embodiment may be seen in FIG. 1A comprising a core 101, an adhesive layer 102, a bottom/inner surface of graphene 103 attached to a metal layer 104 on the top surface of the core 101, and a top/outer surface of graphene 105 attached to a metal layer 104 on the top surface of the core 101.

Once the structure of the lamination stack is in place, as described above in connection with FIG. 1A, the lamination process may be performed. In particular, frictionless substrates 106, 108, 116, and 118 may be placed between the lamination stack (comprising the core 101, at least one adhesive layer 102 and/or 112, and at least one graphene-metal structure 103, 104, 105 and/or 113, 114, 115) and pressure pads 107 and 117 of a lamination apparatus. The pressure pads 107 and 117 may be used to apply pressure to the lamination stack at a steady rate or at varying rates so as to apply optimal pressure without creating breakage or separation of layers of the lamination stack or its components. The frictionless substrates 106, 108, 116, and 118 allow for easier removal of the lamination stack from the pressure pads 107 and 117, thereby reducing the chance for breakage by minimizing the risk of the lamination stack sticking to the pressure pads 107 and 117. Lastly, carrier plates 109 and 119 may be used to carry the lamination stack through the lamination process (e.g., through a lamination apparatus, such as the CVD System of the applications incorporated by reference herein), which may apply the pressure with the pressure pads 107 and 117.

In all of the listed embodiments herein described, and as will be understood by one skilled in the art in light of this disclosure, the graphene layer may comprise a monolayer of graphene (e.g., a single atom of thickness) or a multi-layer of graphene (e.g., comprising multiple monolayers of graphene stacked, or grown, on top of each other).

In some embodiments, a lamination stack is formed that includes both top and bottom graphene-metal structures with respect to the core. With reference to FIG. 1B, a core 151 is provided. The adhesive layer(s) 152, 172 of the lamination stack may be applied directly to the surface of the core 151 as described above with respect to FIG. 1. The adhesive layer(s) 152, 172 may be applied to the bottom or top surface of the core 151, or both surfaces of the core 151 within the lamination stack.

In some cases, more than one graphene-metal structures 153, 154, 155; 156, 157, 158 may be attached to a top surface of the core 151 using the adhesive layer 152. Moreover, in some embodiments, multiple graphene-metal structures 173, 174, 175; 176, 177, 178 may be attached to a bottom surface of the core 151 using the adhesive layer 172. In some embodiments, the lamination stack of FIG. 1B may only comprise one graphene-metal structure (e.g., 153, 154, 155; 156, 157, 158; 173, 174, 175; or 176, 177, 178), may comprise two graphene metal structures of any combination of the graphene-metal structures herein listed (e.g., graphene-metal structure 153, 154, 155 may be coupled with the graphene-metal structure 156, 157, 158; or the graphene-metal structure 173, 174, 175 may be coupled with the graphene-metal structure 176, 177, 178 within the lamination stack, graphene-metal structure 153, 154, 155 may be coupled with the graphene-metal structure 173, 174, 175, and all other combinations of graphene-metal structures herein listed).

The top-most or bottom-most graphene metal structures—156, 157, 158 and 176, 177, 178, respectively—may be used as a frictionless material between the graphene layers. For instance, graphene layer placed adjacent to another graphene layer can form a frictionless interface between the two graphene layers such that the layers may easily be removed from each other. Thus, even after the lamination process described herein has taken place to form the PCB, if the top-most or bottom-most graphene-metal structures need to be removed, the top-most and bottom-most graphene-metal structures may be removed without any structural damage to the PCB (post-process lamination stack) (e.g., the 156 graphene layer, including the rest of the top-most graphene-metal structure of 156, 157, 158, may be removed from the 155 graphene layer).

In other embodiments, one or more graphene-metal structures may be added such that a third graphene-metal structure may be placed adjacent to the top-most and/or bottom-most graphene metal structures shown in FIG. 1B, 156, 157, 158 and/or 176, 177, 178, respectively. Such embodiments would then have three graphene-metal structures (not pictured) on either, or both, the top surface of the core 151 and the bottom surface of the core 151. Further, additional graphene-metal structures beyond the three layers described herein may be used, especially for the purpose of increasing trace surface area without increasing the length and width of the PCB to an unusable size for the purposes of small electronics. In such embodiments, a conductive material may be placed between the metal structures for each PCB comprising multiple graphene-metal structures to connect the multiple graphene-metal structures after they have been traced to create a conductive pathway. Such conductive materials may include copper (Cu) rods to connect the traces formed from each metal layer. In some embodiments, a prepreg material may be comprised between the graphene-metal structures to act as a glue between the graphene-metal structures when heat and pressure under vacuum or controlled gas atmosphere are applied.

In some embodiments, the multiple graphene-metal structures added around the core 151, such that the top-most graphene-metal structure 156, 157, 158 and bottom-most graphene-metal structure 176, 177, 178, may not be removed post-lamination process. Instead, holes may be drilled through the one or more graphene-metal structures attached to the top surface of the core (e.g., graphene-metal structures 153, 154, 155 and 156, 157, 158) and conductive material (e.g., copper or nickel) may be placed in the holes to connect the metal layers of each graphene-metal structure (e.g., connect the metal layers 154 and 157). By connecting the metal layers, the surface area of the trace may be enlarged without further enlarging the PCBs surface area in a horizontal direction and (only minimally) increasing the PCB thickness in a vertical direction as the graphene monolayers are very thin (e.g., the graphene monolayers ranging from 0.335 nm-1000 nm in thickness for multiple graphene layers). Additionally, the process of drilling holes and placing conductive materials to connect layers of conductive materials (e.g., connecting the metal layers of the graphene-metal structures) may be repeated for the graphene-metal structures attached to the bottom surface of the core (e.g., 173, 174, 175 and 176, 177, 178) and any additional graphene-metal structures that may be added to the present invention.

With reference to FIG. 2, a core 201 is provided as the non-conductive material of the lamination stack of the PCB. The adhesive layer(s) 202, 212 of the lamination stack may thus be applied directly to a surface of the core 201. The adhesive layer(s) 202, 212 may be applied to the bottom (212) or top surface (202) of the core 201, or both the bottom and top surfaces within the lamination stack. A graphene-metal structure 203-205 may be attached to a surface of the core using the adhesive layer(s) 202, 212. In some embodiments, the graphene-metal structure may comprise only one graphene layer and one metal layer when it is attached to a surface of the core 201. The graphene-metal structure, in those noted embodiments, may comprise a graphene layer on the bottom/inner surface of the metal layer (e.g., 203) on the top surface of the core 201; a graphene layer on the top/inner surface of the metal layer (e.g., 213) on the bottom surface of the core 201; a graphene layer on the top/outer surface of the metal layer (e.g., 205) on the top surface of the core 201; a graphene layer on the bottom/outer surface of the metal layer (e.g., 215) on the bottom surface of the core 201; or any combination thereof.

In some embodiments, the graphene metal structure of FIG. 2 may comprise a metal layer having a graphene layer on both a top surface and a bottom surface attached to the core 201. An example of such embodiment may be seen in FIG. 2 comprising a core 201, an adhesive layer 202, a bottom/inner surface of graphene 203 attached to a metal layer 204, and a top/outer surface of graphene 205 attached to the metal layer 204. In addition, a second graphene-metal structure may be attached to the bottom surface of the core 201 similar to that shown in FIG. 2. For instance, the second graphene-metal structure (e.g., 213, 214, 215) may be attached to the bottom surface of the core 201 using the adhesive layer 212, such that there is a graphene layer 213 on the top/inner surface of the metal layer; a graphene layer on the bottom/outer surface of the metal layer 215 on the bottom surface of the core 201; or any combination thereof.

In still other embodiments, the graphene-metal structure of the lamination stack may only comprise one layer of graphene on a surface of the metal structure. For instance, in FIG. 2, only a graphene-metal structure comprising the metal structure 204 and graphene layer 205 or 203 may be grown on the metal structure 204. Additionally, the bottom graphene-metal structure 213-215 attached the bottom surface of the core 201 may also only comprise a metal structure 214 and graphene layer 213 or 215, which can be grown on the metal structure 204. Any combinations of the structure described herein may also be understood by someone of skill in the art.

With reference to FIG. 3, a PCB (post lamination process of the lamination stack) is shown. The PCB comprises the core 301; the bottom/inner layer of graphene 303 of the graphene-metal structure attached to the top surface of the core 301; the metal structure 304 of the graphene-metal structure; the top/outer layer of graphene 305 of the graphene-metal structure attached to the top surface of the core 301; and the top/inner layer of graphene 313 attached to the bottom surface of the core 301.

After the lamination process described herein has been used to form the PCB, the graphene-metal structure of the PCB may undergo a lithography process to outline the conductive path(s) (i.e., trace) of the PCB, then the PCB may undergo a laser ablation or chemical etching process to create the trace on the surface of the PCB.

In some embodiments, the outline of the trace of the PCB may be made through a lithography process or laser ablation. The pre-designed trace (or conductive path) of the PCB may be outlined on a photomask, which may then be placed on a photo-sensitive (e.g., light-sensitive) chemical photoresist, where the photoresist was previously applied to the surface of the PCB.

In some embodiments, after the outline of the trace of the PCB is created, a laser ablation process may be used to remove unwanted material(s) from the PCB (e.g., excess copper and graphene not protected by the lithography trace outline) to form the trace of the PCB. In some embodiments, the laser ablation process starts by irradiating the surface of the PCB in specific localized areas, which in turn heats the material and causes the unwanted material to evaporate in the chosen localized areas. Such materials that may be removed to create the trace of the PCB include the surrounding graphene-metal structures outside the specific outline of the trace created by the lithography process. The laser of the laser ablation process may remove the graphene-metal structures on the surface of the PCB such that only the core is left underneath.

In some embodiments, and after the outline of the trace of the PCB is created through lithography, a chemical etching process may be used to remove unwanted material(s) from the PCB (e.g., excess copper and graphene not protected by the lithography trace outline), to form the trace of the PCB. The chemical etching process of the PCB may comprise plasma etching of the graphene of the graphene-metal structure(s) using such material as argon or oxygen plasma. The chemical etching process may continue by etching the metal structure using a metal etchant (e.g., for a copper metal structure a copper etchant may be used). An example PCB after the traces have been made, either via laser ablation, chemical etching, or another known process, may be seen in FIG. 3 as the post-etched PCB.

FIG. 4 is a flowchart providing an example method 400 for facilitating the lamination stack in accordance with one or more embodiments of the present invention. It will be understood that each block of the flowcharts, and combinations of blocks in the flowcharts, may be implemented by various means. In some example embodiments, certain ones of the operations herein may be modified or further amplified as described below. Moreover, in some embodiments additional optional operations may also be included. It should be appreciated that each of the modifications, optional additions, or amplifications described herein may be included with the operations herein either alone or in combination with any others among the features described herein. The operations illustrated in FIG. 4 may, for example, be performed by an example apparatus (not pictured) to add each material or layer (e.g., core, adhesive layer, graphene-metal structure, etc.) to form the PCB.

The method (e.g., method 400) may include the steps of providing a core to form the lamination stack at block 401.

Embodiments of the method may further include applying an adhesive layer to the top surface of the core at step 402. At step 403, a graphene-metal structure (e.g., a graphene-metal-graphene structure) may be attached to the top or bottom surface of the core via the adhesive layer before the lamination process of step 404 (heating and pressurizing of the lamination stack under vacuum or controlled gas atmosphere) takes place. The graphene-metal structure (pre-lamination process) may have one or more layers of graphene grown on the metal layer of the graphene-metal structure before the lamination process is conducted or as part of the lamination process.

Many modifications and other embodiments of the present inventions set forth herein will come to mind to one skilled in the art to which these inventions pertain having the benefit of the teachings presented in the foregoing descriptions and the associated drawings. Therefore, it is to be understood that the present inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

The invention claimed is:

1. A lamination stack comprising:
a core;
a first adhesive layer applied to a top surface of the core;
a first graphene-metal structure attached to the top surface of the core via the first adhesive layer, wherein the first graphene-metal structure comprises a first metal layer and a first graphene layer on at least one of a top surface of the first metal layer or a bottom surface of the first metal layer;
a second graphene-metal structure attached to a top surface of the first graphene-metal structure, wherein the second graphene-metal structure comprises a second metal layer and a second graphene layer on at least one of a top surface of the second metal layer or a bottom surface of the second metal layer; and
a second adhesive layer applied to a bottom surface of the core.

2. The lamination stack of claim 1, further comprising a third graphene-metal structure attached to the bottom surface of the core via the second adhesive layer, wherein the third graphene-metal structure comprises a third metal layer and a third graphene layer on at least one of a top surface of the third metal layer or a bottom surface of the third metal layer.

3. The lamination stack of claim 2, further comprising a fourth graphene-metal structure attached to a bottom surface of the third graphene-metal structure, wherein the fourth graphene-metal structure comprises a fourth metal layer and a fourth graphene layer on at least one of a top surface of the fourth metal layer or a bottom surface of the fourth metal layer.

4. The lamination stack of claim 1, further comprising one or more holes, wherein each hole is defined by the metal layer of the first graphene-metal structure, the second metal layer of the second graphene-metal structure, and intervening layers.

5. The lamination stack of claim 4, wherein the one or more holes are filled with conductive material.

6. The lamination stack of claim 1, wherein the first graphene-metal structure comprises a first graphene layer on the top surface of the first metal layer and a first graphene layer on the bottom surface of the first metal layer.

7. The lamination stack of claim 6, wherein the second graphene-metal structure comprises a second metal layer, a second graphene layer on a top surface of the second metal layer, and a second graphene layer on a bottom surface of the second metal layer.

8. The lamination stack of claim 1, further comprising a third graphene-metal structure attached to the bottom surface of the core via the second adhesive layer, wherein the third graphene-metal structure comprises a third metal layer, a third graphene layer on a top surface of the third metal layer, and a third graphene layer on a bottom surface of the third metal layer.

9. The lamination stack of claim 8, further comprising a fourth graphene-metal structure attached to a bottom surface of the third graphene-metal structure, wherein the fourth graphene-metal structure comprises a fourth metal layer, a fourth graphene layer on a top surface of the fourth metal layer, and a fourth graphene layer on a bottom surface of the fourth metal layer.

10. The lamination stack of claim 9, wherein an interface between adjacent graphene layers is a frictionless interface, wherein each frictionless interface is configured to facilitate removal of the lamination stack from at least one pressure pad applied to the lamination stack.

11. The lamination stack of claim 1, wherein an outermost side of the second graphene-metal structure opposite the first graphene-metal structure is configured to receive a frictionless substrate, wherein the frictionless substrate is configured to facilitate removal of the lamination stack from at least one pressure pad applied to the lamination stack.

12. The lamination stack of claim 1, wherein at least one of the first graphene layer or the second graphene layer is a monolayer.

13. A lamination stack comprising:
a core;
a first adhesive layer applied to a top surface of the core;
a first graphene-metal structure attached to the top surface of the core via the first adhesive layer, wherein the first graphene-metal structure comprises a first metal layer and a first graphene layer on at least one of a top surface of the first metal layer or a bottom surface of the first metal layer; and
a second graphene-metal structure attached to a top surface of the first graphene-metal structure, wherein the second graphene-metal structure comprises a second metal layer and a second graphene layer on at least one of a top surface of the second metal layer or a bottom surface of the second metal layer,
wherein the lamination stack comprises one or more holes, wherein each hole is defined by the first metal layer of the first graphene-metal structure, the second metal layer of the second graphene-metal structure, and intervening layers.

14. The lamination stack of claim 13, further comprising a second adhesive layer applied to a bottom surface of the core.

15. The lamination stack of claim 14, further comprising a third graphene-metal structure attached to the bottom surface of the core via the second adhesive layer, wherein the third graphene-metal structure comprises a third metal layer and a third graphene layer on at least one of a top surface of the third metal layer or a bottom surface of the third metal layer.

16. The lamination stack of claim 15, further comprising a fourth graphene-metal structure attached to a bottom surface of the third graphene-metal structure, wherein the fourth graphene-metal structure comprises a fourth metal layer and a fourth graphene layer on at least one of a top surface of the fourth metal layer or a bottom surface of the fourth metal layer.

17. The lamination stack of claim 13, wherein the one or more holes are filled with conductive material.

18. The lamination stack of claim 13, wherein the first graphene-metal structure comprises a first graphene layer on the top surface of the first metal layer and a first graphene layer on the bottom surface of the first metal layer.

19. The lamination stack of claim 18, wherein the second graphene-metal structure comprises a second metal layer, a second graphene layer on a top surface of the second metal layer, and a second graphene layer on a bottom surface of the second metal layer.

20. The lamination stack of claim 19, further comprising a second adhesive layer applied to a bottom surface of the core and a third graphene-metal structure attached to the bottom surface of the core via the second adhesive layer, wherein the third graphene-metal structure comprises a third metal layer, a third graphene layer on a top surface of the third metal layer, and a third graphene layer on a bottom surface of the third metal layer.

21. The lamination stack of claim 20, further comprising a fourth graphene-metal structure attached to a bottom surface of the third graphene-metal structure, wherein the fourth graphene-metal structure comprises a fourth metal layer, a fourth graphene layer on a top surface of the fourth metal layer, and a fourth graphene layer on a bottom surface of the fourth metal layer.

22. The lamination stack of claim 21, wherein an interface between adjacent graphene layers is a frictionless interface, wherein each frictionless interface is configured to facilitate removal of the lamination stack from at least one pressure pad applied to the lamination stack.

23. The lamination stack of claim 13, wherein an outermost side of the second graphene-metal structure opposite the first graphene-metal structure is configured to receive a frictionless substrate, wherein the frictionless substrate is configured to facilitate removal of the lamination stack from at least one pressure pad applied to the lamination stack.

24. The lamination stack of claim 13, wherein at least one of the first graphene layer or the second graphene layer is a monolayer.

25. A lamination stack comprising:
a core;
a first adhesive layer applied to a top surface of the core;
a first graphene-metal structure attached to the top surface of the core via the first adhesive layer, wherein the first graphene-metal structure comprises a first metal layer, a first graphene layer on a top surface of the first metal layer, and a first graphene layer on a bottom surface of the first metal layer;
a second graphene-metal structure attached to a top surface of the first graphene-metal structure, wherein the second graphene-metal structure comprises a second metal layer, a second graphene layer on a top surface of the second metal layer, and a second graphene layer on a bottom surface of the second metal layer; and
a second adhesive layer applied to a bottom surface of the core.

26. The lamination stack of claim 25, further comprising a third graphene-metal structure attached to the bottom surface of the core via the second adhesive layer, wherein the third graphene-metal structure comprises a third metal layer and a third graphene layer on at least one of a top surface of the third metal layer or a bottom surface of the third metal layer.

27. The lamination stack of claim 26, further comprising a fourth graphene-metal structure attached to a bottom surface of the third graphene-metal structure, wherein the fourth graphene-metal structure comprises a fourth metal layer and a fourth graphene layer on at least one of a top surface of the fourth metal layer or a bottom surface of the fourth metal layer.

28. The lamination stack of claim 25, further comprising one or more holes, wherein each hole is defined by the first metal layer of the first graphene-metal structure, the second metal layer of the second graphene-metal structure, and intervening layers.

29. The lamination stack of claim 28, wherein the one or more holes are filled with conductive material.

30. The lamination stack of claim 25, further comprising a third graphene-metal structure attached to the bottom surface of the core via the second adhesive layer, wherein the third graphene-metal structure comprises a third metal layer, a third graphene layer on a top surface of the third metal layer, and a third graphene layer on a bottom surface of the third metal layer.

31. The lamination stack of claim 30, further comprising a fourth graphene-metal structure attached to a bottom surface of the third graphene-metal structure, wherein the fourth graphene-metal structure comprises a fourth metal layer, a fourth graphene layer on a top surface of the fourth metal layer, and a fourth graphene layer on a bottom surface of the fourth metal layer.

32. The lamination stack of claim 31, wherein an interface between adjacent graphene layers is a frictionless interface, wherein each frictionless interface is configured to facilitate removal of the lamination stack from at least one pressure pad applied to the lamination stack.

33. The lamination stack of claim 25, wherein an outermost side of the second graphene-metal structure opposite the first graphene-metal structure is configured to receive a frictionless substrate, wherein the frictionless substrate is configured to facilitate removal of the lamination stack from at least one pressure pad applied to the lamination stack.

34. The lamination stack of claim 25, wherein at least one of the first graphene layer or the second graphene layer is a monolayer.

* * * * *